United States Patent
Messerly et al.

(10) Patent No.: US 6,581,081 B1
(45) Date of Patent: Jun. 17, 2003

(54) ADAPTIVE SIZE FILTER FOR EFFICIENT COMPUTATION OF WAVELET PACKET TREES

(75) Inventors: Shayne Messerly, Farmington, UT (US); Todor Cooklev, Salt Lake City, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/489,767

(22) Filed: Jan. 24, 2000

(51) Int. Cl.[7] ............................................. G06F 17/10
(52) U.S. Cl. ..................... 708/322; 708/319; 708/316
(58) Field of Search ............................... 708/319, 316, 708/322, 318

(56) References Cited

U.S. PATENT DOCUMENTS

| | | | | |
|---|---|---|---|---|
| 4,815,023 A | | 3/1989 | Arbeiter | 364/724.01 |
| 4,974,187 A | | 11/1990 | Lawton | 364/728.01 |
| 5,347,479 A | | 9/1994 | Miyazaki | 364/725 |
| 5,420,891 A | | 5/1995 | Akansu | 375/350 |
| 5,487,023 A | * | 1/1996 | Seckora | 708/319 |
| 5,497,398 A | | 3/1996 | Tzannes et al. | 375/260 |
| 5,706,222 A | | 1/1998 | Bonaccio et al. | 364/847 |
| 5,790,439 A | * | 8/1998 | Yamanaka et al. | 708/319 |
| 5,875,122 A | | 2/1999 | Acharya | 364/726.05 |
| 5,886,912 A | * | 3/1999 | Miyake et al. | 708/316 |
| 6,163,788 A | * | 12/2000 | Chen et al. | 708/319 |
| 6,192,386 B1 | * | 2/2001 | Shinde | 708/319 |
| 6,308,192 B1 | * | 10/2001 | Messerly | 708/322 |

OTHER PUBLICATIONS

Vishwanath, Mohan, "The Recursive Pyramid Algorithm for the Discrete Wavelet Transform," IEEE Transactions on Signal Processing, vol. 42, No. 3, Mar. 1994.

* cited by examiner

*Primary Examiner*—Tan V. Mai
(74) *Attorney, Agent, or Firm*—Workman, Nydegger & Seeley

(57) ABSTRACT

This invention describes a novel method and system that implements wavelet packet trees and inverse wavelet packet trees. A modified Recursive Pyramid Algorithm (RPA) is advanced by this invention. The algorithm uses a filter that changes its size at each given octave of the wavelet packet tree. This filter may also be used in the reconstruction, synthesis, or inverse wavelet packet tree using RPA. The invention reduces the cost of implementing wavelet packet trees by using the same hardware for each octave and thereby offers superior products at attractive prices.

20 Claims, 6 Drawing Sheets

ADAPTIVE SIZE FILTER FOR EFFICIENT COMPUTATION OF WAVELET PACKET TREES

BACKGROUND OF THE INVENTION

1. The Field of the Invention

This invention relates generally to architectures associated with computation and implementation of the discrete wavelet transform using the Recursive Pyramid Algorithm (RPA). More specifically, the present invention relates to adaptive size filters useful in calculating and implementing wavelet packet trees.

2. The Prior State of the Art

The discrete Fourier transform (DFT) is fundamental to a number of applications, but until the mid-1960s the computational complexity made DFT implementations prohibitively costly. Computational complexity was one factor that contributed to prevent DFT applications from gaining widespread acceptance, until Cooley and Tukey developed a fast algorithm for DFT calculation in 1965. The Cooley-Tukey discovery triggered enormous research activity both in the development of DFT applications and in the development of efficient computation algorithms for the DFT. At present, the DFT is most often implemented using a digital signal processor (DSP); as such, DSP architecture is often specifically tailored to enable the fast computation of the DFT.

The advance of filter banks and transforms in the 1980s resulted in a similar resurgence of research activity related to the DFT, one significant research advance was the development of the Discrete Wavelet Transform (DWT). The DWT or wavelet transform is a multi-resolution decomposition of a signal, where an original signal is decomposed into various signal components at different frequency levels or octave bands. Wavelet transforms provide a time-scale representation of signals as an alternative to traditional time-frequency representations. The wavelet transform is very efficient for multi-resolution sub-band decomposition of signals.

The wavelet transform provides superior performance when compared with other orthogonal transforms like the discrete cosine transform (DCT) and the discrete Fourier transform (DFT). The primary reasons that the DWT is considered better than either a DFT or DCT are because the DWT tiles the time frequency plane in a general fashion and thus possesses inherent scalability.

It is well known and appreciated that the wavelet transform provides numerous advantages. Presently, the main applications for DWT and wavelet transforms are in image and speech signal compression, multi-carrier modulation, and solving partial differential equations. Wavelets will play a very important role in the converged communication networks of the future.

Unfortunately, one of the main disadvantages of the wavelet transform is their complexity; most of the known DWT require intensive computations and parallel processing for real time applications. This means that wavelet transforms generally cost more to implement than the comparable DCT or DFT solutions. As a result, the vast majority of multi-carrier modulation modems for high-speed communications over copper wire use DFT applications and the majority of commercially available video compressors are based on DCT applications. What is needed is an architecture that is able to reduce the cost of implementing wavelet transforms and thereby be able to offer superior products at attractive prices.

DWT can also be viewed as a multi-resolution decomposition of a discrete-time sequence. For example, the DWT decomposes a discrete-time sequence: $a = \{a_0, a_1, \ldots, a_{n-1}\}$ into a high pass sub-band:

$$b = \left\{b_0, b_1, \ldots, b_{\frac{n}{2}-1}\right\}$$

and a low pass sub-band:

$$c = \left(c_0, c_1, \ldots, c_{\frac{n}{2}-1}\right)$$

that can be represented as:

$$b_n = \sum_k h_{2n-k} a_k \text{ and } c_n = \sum_k g_{2n-k} a_k$$

respectively. After the two-channel filter pair or bank is designed, a wavelet packet tree can be obtained by recursively iterating the two-channel construction. In communications applications, equiripple low pass and high pass filters are normally used, because they provide maximum attenuation for a given filter length and transition bandwidth. It is important to note that even though the filters in the two-channel filter bank are equiripple, the resulting filters from the recursive iteration of the filter bank are not. In fact, one skilled in the art realizes that each iteration of the filter bank tree decreases the stop-band attenuation, whereupon the stop-band attenuation for the filter bank tree will eventually not be satisfied. What is needed is a filter bank tree that uses different size filters on each octave level of the tree. Such a device would allow exactly as many coefficients as are necessary to satisfy the specifications for each octave level of the tree.

Finally, what is needed is a system and method that efficiently implements a wavelet packet tree, which uses different filter coefficients on each octave level of the wavelet packet tree. Therefore, it would be an advance to provide a method and system that is capable of reducing the hardware necessary for the implementation of such a wavelet packet tree.

SUMMARY OF THE INVENTION

An advantage of the invention is that it reduces the cost of implementing a wavelet packet tree by using the same hardware for each octave and is thereby able to offer superior products at attractive prices. Using a filter bank that can utilize different size filters on each octave level of the wavelet packet tree, the present invention allows for exactly as many coefficients as are necessary to satisfy the specification for each octave level of the wavelet packet tree. A related advantage of the invention is that it facilitates the implementation of a multi-resolution decomposition or signal analysis and multi-resolution reconstruction or signal synthesis through a wavelet packet tree while recursively using the same hardware for filtration of a representative signal.

In the preferred embodiment of this invention, the advantageous characteristic of orthogonal filter bank trees, which utilize different filters on each octave level of the tree so that the number of multiplications per octave remains approximately constant, is exploited in a hardware implementation. More specifically, this characteristic enables the same hardware to be used in consecutive computations. The preferred embodiment of the present invention also takes advantage of the fact that the total number of all filter coefficients for a given octave will be the same at each octave level. For example, at the first octave a signal may require eight coefficients or taps per filter bank for a total of 16 coefficients. At the second octave, there may be four filters with four coefficients for a net total of 16 coefficients. The third octave may use 8 filters with two coefficients for a total of 16 coefficients. From this example it can be seen that the sum of all filter coefficients for a given octave does not change due to the branching of the filter bank tree between octaves.

The present invention also takes advantage of the properties related to orthogonal filter banks in that the high pass filter coefficients are the time reversed coefficients of the low pass filter with alternating sign changes. This property has not been used in prior two channel orthogonal filter bank implementations and allows a further reduction in the computational complexity by 50%. A detailed description of the appropriate wavelet packet tree using the RPA is described in U.S. patent application Ser. No. 09/388,754, incorporated in its entirety herein by reference.

The present invention further takes advantage of an efficient algorithm called the recursive pyramid algorithm (RPA), one of the most efficient implementations of the DWT for VLSI applications. However, due to the heavy reliance on the structure shown in FIG. 4, when implementing a wavelet packet tree as shown in FIGS. 2 and 5, the RPA does not function properly due to the decomposition and reconstruction of both the high pass and low pass channels. As shown in FIG. 2, decimation or downsampling, as depicted at the output of each filter in FIG. 4, is part of the DWT. The RPA relies on the fact that the high pass channel will not be decomposed any further, thus rendering it unusable for wavelet packet trees which continue to decompose each octave. The present invention provides an RPA for wavelet packet trees. In the preferred embodiment of the invention, each level or octave of the wavelet packet tree uses a different size filter. In this way on every level of the tree, the preferred embodiment can use exactly as many filter coefficients as are necessary to satisfy the specifications. The number of filter coefficients, N, necessary when using this approach is proportional to the octave or level of the tree and the number of leaves. This approach requires fewer filter coefficients, which translates into fewer MIPS by the DSP or filter.

One embodiment of the present invention describes a filter architecture that will adapt its size so that RPA can be used when implementing a wavelet packet tree. Thus, if a filter bank is prepared for a first octave, the second filter may be computed using the same filter by dividing the first filter into two filters with half the taps of the initial filter, in effect doubling the number of filters. What is needed is to divide the first filter into two filters in the computation of the second octave is to open an output gate splitting the taps into two equal portions. Thus, the second octave can be computed using the same hardware that was used to calculate the first octave, demonstrating how the wavelet packet can be computed using the RPA with no additional hardware costs. The filters adaptive size can be designed to be generic so that given a maximum number of taps in a given octave the filter will be scalable to all other octave levels below the first octave as is depicted in FIG. 1.

The present invention can be combined with the previous inventions to achieve even more efficient implementations. Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated, in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

Figure 1:
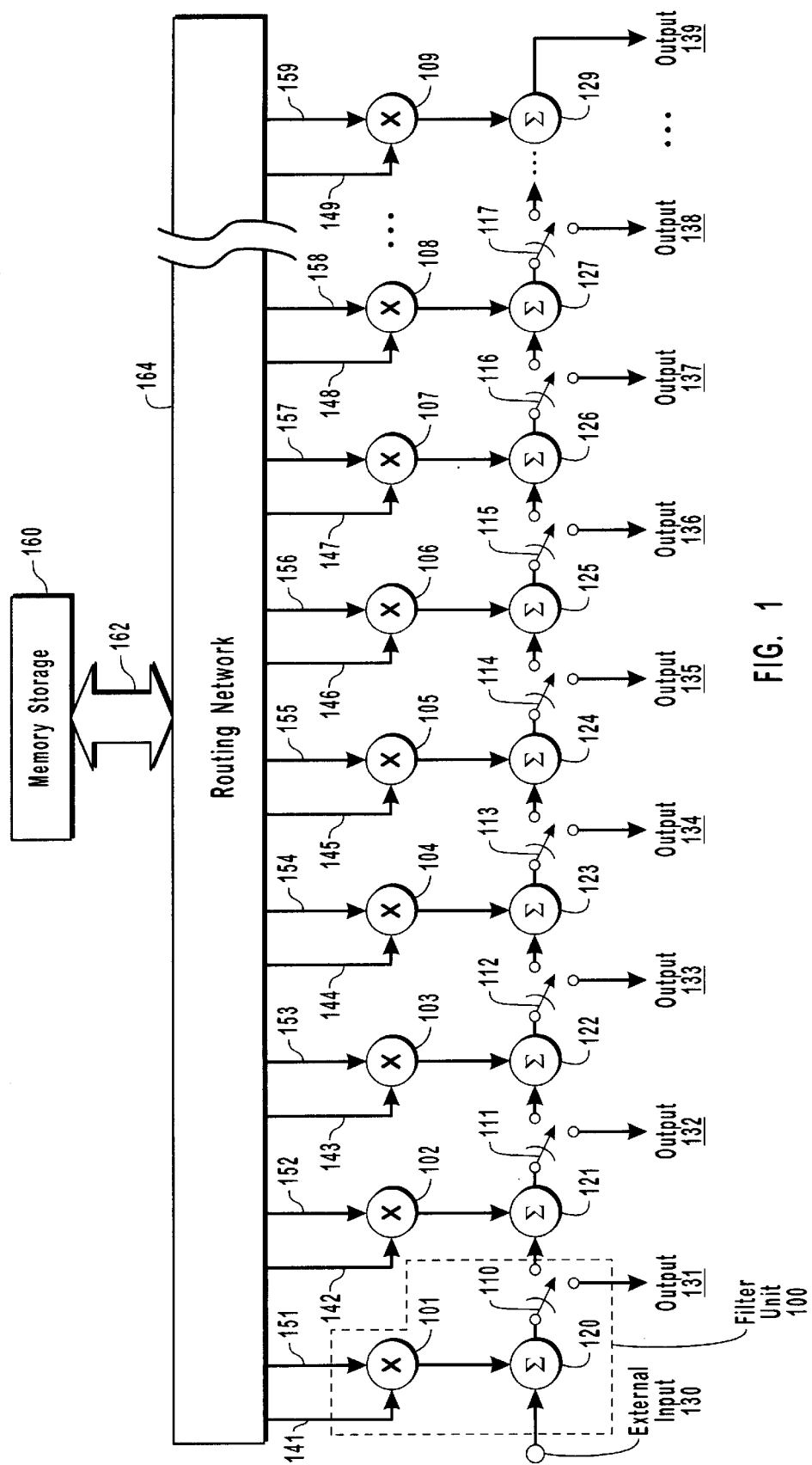
FIG. 1 illustrates an adaptive size filter bank.

FIG. 1 illustrates an adaptive size filter bank useful for efficient computation of wavelet packet trees. The adaptive size filter bank comprises a data interface 162, a routing network 164, and an adaptive size array of individual filter units 100. During signal filtration, multipliers 101–109 receive first inputs 141–149 and second inputs 151–159 from the routing network 164. The result of this multiplication is then passed to filter unit adders 120–129.

Following addition, the signal is sent on to data switches 110–117 that are individually set to either an output or ripple summation setting. When the previous neighboring filter unit's data switch is in an output setting the results of the filter unit multiplier are passed to the filter unit data switch without alteration (adding a zero value). If the previous neighboring filter unit's data switch is set to the ripple summation setting, the result from the attached multiplier is added to the result of the previous neighboring multiplier in an adder. If the filter unit data switch is set to an output setting, then the adder results are placed on the output line for output lines 131–139. However, if the filter unit data switch is set to a ripple summation setting, the adder results are sent to the next neighboring adder.

Typically, a filter unit 100 within the adaptive size filter comprises a first input line, a second input line, a multiplier, an adder, a data switch, and an output line. The first filter unit comprises input line 141, input line 151, multiplier 101, adder 120, data switch 110, and output line 131. Being the first filter unit to produce a signal allows this filter unit to optionally exclude adder 120. However, the illustrated embodiment of the adaptive filter includes adder 120 in the first filter unit such that external input 130 is either attached to the last output line 139 of another adaptive size filter or grounded to produce a zero input signal. Linking the first unit to another adaptive size filter increases the total possible number of taps for the filter, for example two 256 tap filters could be combined into one 512 tap filter.

The filter unit 100 comprising input line 149, input line 159, multiplier 109, adder 129 and output line 139 represent the nth filter unit of an n unit filter, or the last filter unit of the adaptive size filter. Being the last filter unit allows this unit to remove the data switch from the standard configuration, as the results of the adder 129 will always be sent to output line 139. Typically, the adaptive size filter is preferably constructed of filter units 100 in numbers equal to powers of 2. Construction techniques allow the adaptive size filter to contain 1, 2, 4, 8, 16, 32, 64, 128, or 256 individual filter units 100 arranged in an array. The upward restriction of 256 filter units is due to IC construction limitations and it is anticipated that as technology improves more filter units 100 can be used in the adaptive size filter.

In general, the optimal size of the adaptive size filter is the filter size containing all the filter units that are necessary for implementing a wavelet packet tree for a specified resolution, where each filter unit includes at least a multiplier, an adder, and a data switch. Alternatively described, the optimal size of the adaptive filter is the largest filter size for the application that the adaptive size filter will be used with; in each filter application this value may be different. Cost, size, and timing factors will change the optimal size for various applications. For example, if a filter application never needed more than eight filter units to complete a wavelet packet tree a good choice for the adaptive filter size would include eight filter units, as using more filter units would simply add cost, size, and potentially introduce processing delays into the circuit. However, a larger adaptive filter might be useful if the filter application could be processed in parallel so as to facilitate filtration of the signal in parallel.

The first input line of each filter unit carries coefficients and the second input line carries a discrete-time signal for specified resolution. The routing network 164 in its simplest form consists of a multiplexor or a series of multiplexors. However, the flexible nature of the adaptive size filter may also allow for the routing network 164 to be software driven routing, programmable logic devices, or pre-configured logic networks. The first input lines 141–149 may either be serial or parallel word in nature, generally they represent a coefficient for the DWT. Likewise, inputs 151–159 may either be serial in nature or may be a word input.

The multipliers 101–109 are preferably standard word multipliers but may also be serial multipliers. The adders 121–129 may either be serial adders or parallel adders with a specified bandwidth. Data switches 110–117 allow the filter to be adaptive on a filter unit level. These data switches are controlled based on the octave or level of the computation through a control means. This control means may be associated with the control of the routing network, set by the processor, or by a dedicated control module for the array of data switches. For example, if the adaptive network was established to create an eight tap filter, then data switch 117 would be open to the output setting whereas data switches 110–116 would be set send signals through adders 121–127 for the first octave calculation.

Following the first octave calculation, data switches 113 and 117 would be set to the output setting. Following the third octave, gates 111, 113, 115, and 117 would be set to the output setting and in the fourth octave, data switches 110–117 would be set to the output setting. The output signals 131–139 can be re-routed into the routing network or into the memory storage 160. The result of this flexible routing allows the same filter to be used through each octave calculation. The DWT downsampling of every other signal sample provides the eight tap filter with an open work cycle to accomplish the second, third and fourth level or octave computations. The signals constructed at each octave of the eight tap filter are depicted in FIG. 2 and the timing diagram therefore is provided in FIG. 3.

A bi-directional interface 162 between the memory 160 and the routing network 164 allows the routing network 164 to request specific memory information and for the memory 160 to provide the signal feedback. This, as previously mentioned, allows the output from output lines 131–139 to be placed into a temporary memory position with memory 160 and then fed into the filter at the next appropriate clock/work cycle. As the adaptive size filter is primarily comprised of individual filter units 100 it is a good candidate for a VLSI and/or ASIC design that may allow for additional size reductions due to the filter unit design replication.

Figure 2:
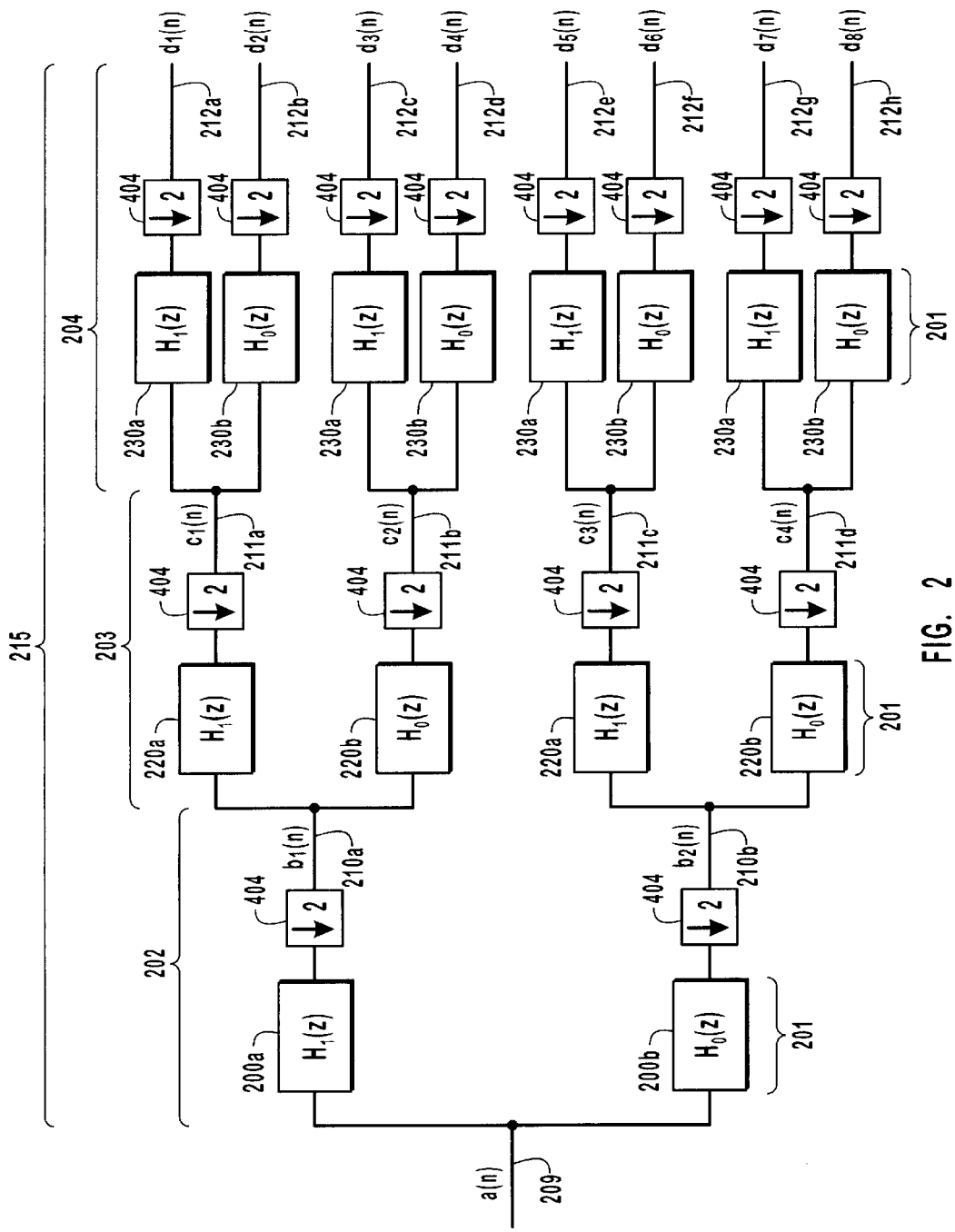
FIG. 2 depicts a block diagram of a filter bank structure that can be used to implement a wavelet packet tree configured for signal decomposition.
Figure 3:
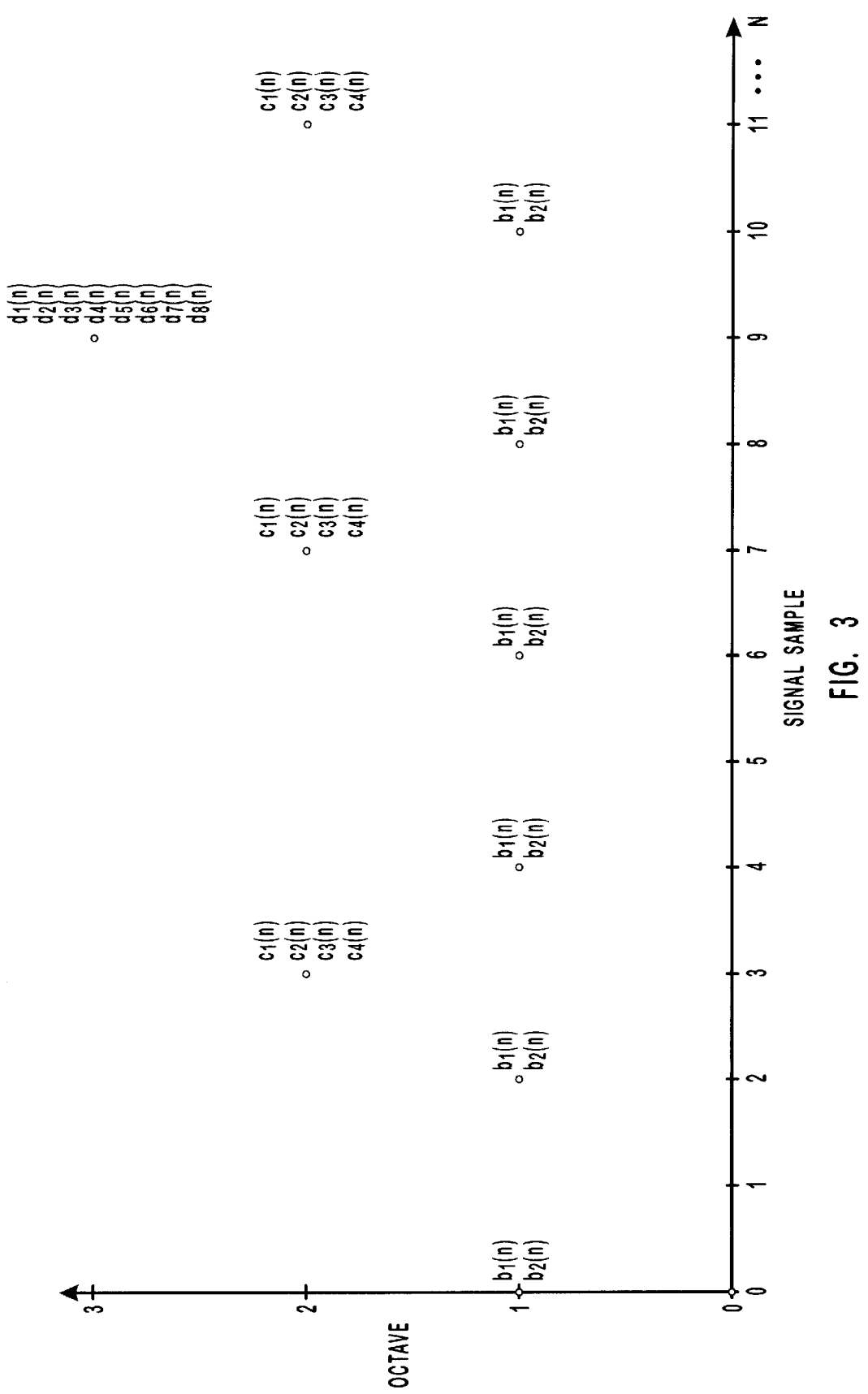
FIG. 3 illustrates a timing diagram for signal samples generated from the filter structure implementing the recursive pyramid algorithm (RPA)

FIG. 2 provides a block diagram wherein signal a(n) 209 is submitted into two filters, in which one filter is performing the high pass filtration decimation designated by $H_1(z)$ 200a and the second filter represents the low pass filtration designated by $H_0(z)$ 200b. The analysis filters $H_1(z)$ and $H_0(z)$ translated into polynomial representations are:

$$H_z = h_0 + h_1 z^{-1} + h_2 z^{-2} + \ldots + h_N z^{-N}$$

and $$H_z = h_N - h_{N-1} z^{-1} + h_{N-2} z^{-2} - \ldots - h_0 z^{-N}$$

Where $h_0[0], h_0[1], h_0[2], \ldots h_0[N]$ are the low pass filter coefficients. The high pass filter is related to the low pass filter according to:

$$H_1(z) = -z^{-N} \tilde{H}_0(-z)$$

Where $\tilde{H}_0$ represents the transposition, conjugation of the coefficients, and replacing $z$ by $z^{-1}$. Signal $b_1(n)$ 210a and $b_2(n)$ 210b are created from these two filters. Signal $b_1(n)$ 210a is fed into an additional high pass/low pass filter combination of $H_1(z)$ 220a and $H_0(z)$ 220b creating signals $c_1(n)$ 211a and $c_2(n)$ 211b. Signal $b_2(n)$ 210b is fed into the low pass filters $H_1(z)$ 220a and $H_0(z)$ 220b creating signal c3(n) 211c and $c_4(n)$ 211d. Two samples are required to provide the two valid coefficients for the multiplication, the $c_1(n)$–$c_4(n)$ 211 signals can only be created after two sampling phases of the $b_1(n)$ 210a and $b_2(n)$ 210b signals 210. Therefore the $c_1(n)$–$c_4(n)$ 211 signals are not valid signals until the third clock cycle as illustrated in FIG. 3. Similarly, the production of filter output $d_1(n)$–$d_8(n)$ signals 212 is not valid until two samples have been created from the c(n) signals 211. Making the output for the $d_1(n)$–$d_8(n)$ signals 212 or sampling outputs invalid until the ninth clock cycle as depicted in FIG. 3.

FIG. 2 may also illustrate the reduction of taps in individual filters between each octave level where the analysis filters are designed to have equal bandwidth frequency responses in a wavelet packet tree configuration. The configuration also demonstrates the constancy of the total number of filter taps between each octave level in the wavelet packet tree. For example, if there are eight taps for the high pass $H_1(z)$ filter 200a and eight taps for the low pass $H_0(z)$ filter 200b in the initial octave 202, then the second octave 203 can use four taps for each of the high pass $H_1(z)$ filters 220a on the resulting high signal $b_1(n)$ on line 210a and four taps on the resulting low signal $b_2(n)$ on line 210b making a total of eight taps performing the high pass filtration. The low pass $H_0(z)$ filters 220b, also have four taps for the $b_1(n)$ signal on line 210a and four taps for the $b_2(n)$ signal on line 210b. Thus, the number of taps used in the low and high pass filtration remains at sixteen. In the third octave, the signals will be filtered by four sets of two tap filters on the high pass $H_1(z)$ filters 230a and four sets of two tap filters on the low pass $H_0(z)$ filters 230b, once again using the equivalent of 2 eight tap filters or sixteen taps. If a fourth octave were calculated, each filter would be a single tap filter resulting in 8 one tap high pass $H_1(z)$ filters, and 8 one tap low pass $H_0(z)$ filters. By taking advantage of this reduction in coefficients, the adaptive size filter for efficient computation of wavelet packet trees can use the same hardware to calculate an entire wavelet packet tree at close to complete utilization, depending on the size of the original sample signal.

This provides the user an efficient manner of obtaining higher resolution with the same size filter processor. However, it is foreseeable that as these restraints are overcome such an adaptive size filter will be increased in size as this technology improves. In the meantime, linking the filters together can create larger filters.

In one embodiment of a three stage decomposition wavelet transform system 215 similar to that depicted in FIG. 2, an original discrete-time signal, $a(n)$ is input on line 209. This original signal, $a(n)$, is filtered by filters 200a and 200b, which have the transfer functions $H_1(z)$ and $H_0(z)$, respectively. According to the present invention, the analysis filters 200a and 200b are designed to have equal bandwidth frequency responses. Thus, the original signal, $a(n)$, is divided into two equal bandwidth subband signals consisting of a low frequency subband signal and a high frequency subband signal.

After the original signal, $a(n)$, is filtered by $H_1(z)$ filter 200a in the first stage or first octave 202, the high frequency subband signal $b_1(n)$ on line 210a is equally divided into two second subband signals, a high frequency and a low frequency second subband signal. The original signal is filtered by $H_0(z)$ filter 200b and becomes low frequency subband signal $b_2(n)$ on line 210b. This low frequency subband signal is also divided into two equal bandwidth second subband signals, a low frequency second subband signal and a high frequency second subband signal. These second subband signals are filtered as part of the second octave 203 using high frequency subband filters 220a and low frequency subband filters 220b for the respective $b(n)$ signals 210, thereby creating third subband signals $c(n)$ 211.

Finally, in the third octave 204, each of the resulting low and high frequency second subband signals from the second octave are divided into two equal bandwidth third subband signals for each signal. In other words, the highest high band frequency subband $c_1(n)$ is divided into a high frequency subband signal and a low frequency subband signal and filtered through $H_1(z)$ filter 230a for the high subband signal and $H_0(z)$ filter 230b for the low subband signal resulting in the output signals $d_1(n)$ on line 212a and $d_2(n)$ on line 212b. The same transformation occurs for each third subband signal in the third octave resulting in eight output signals $d_1(n)$–$d_8(n)$ occurring on the output lines 212.

Figure 5:
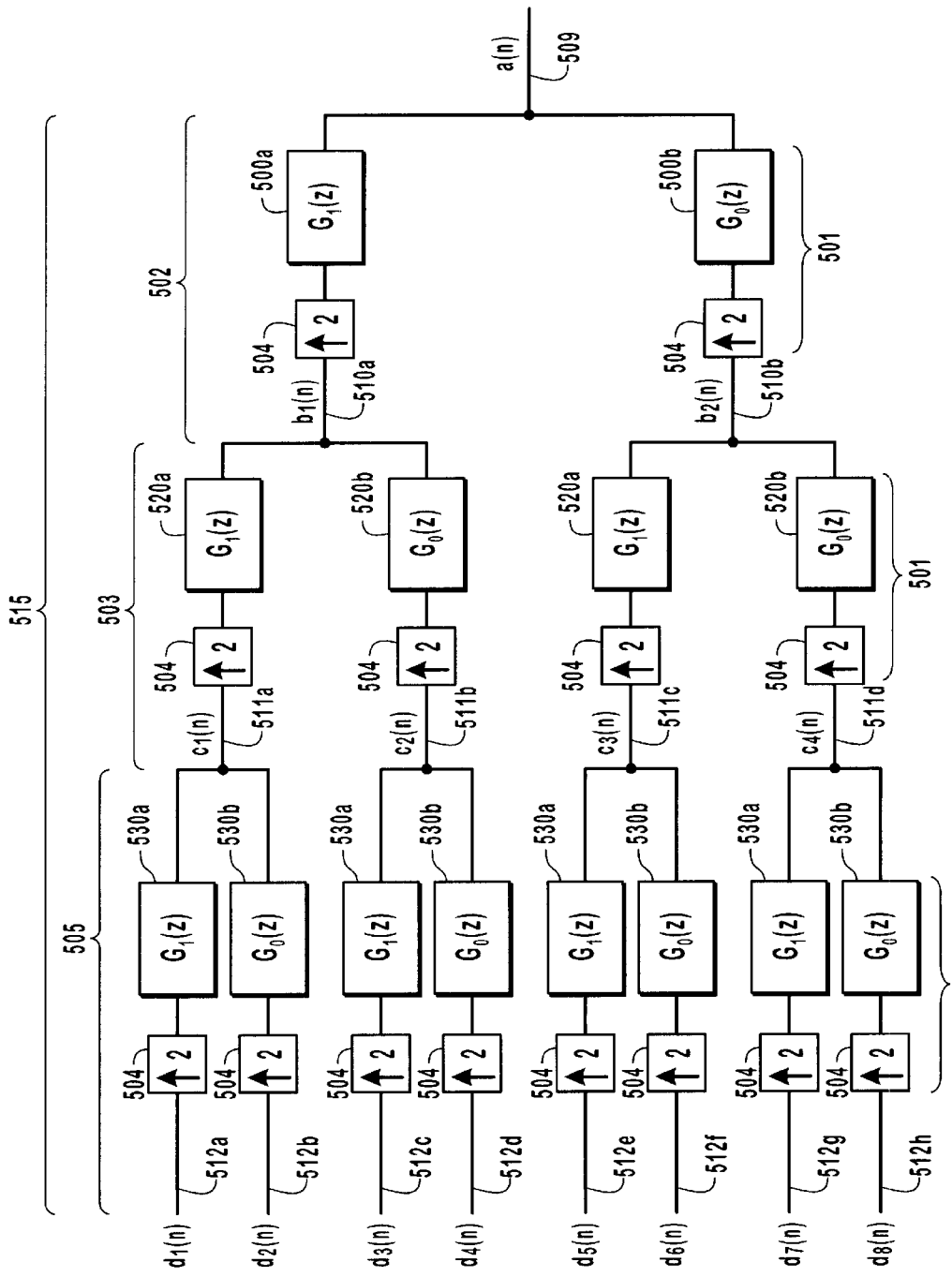
FIG. 5 depicts a block diagram of a filter bank structure implementing a wavelet packet tree configured for signal reconstruction.

In applications like signal coding, the resulting filtered and decimated signals can then be optionally encoded by means of signal coders for transmission via output lines 212. Once the signals arrive at the receiver section, a filter bank structure as depicted in FIG. 5, the filtration mirror image of FIG. 2, may be used to reconstruct the signal. Since downsampling occurred at each octave when the signal was decomposed, an upsampling needs to occur at each octave as the signal is reconstructed. This allows the total number of samples to be restored to the original signal, $a(n)$. The synthesis filters, $G_0(z)$ and $G_1(z)$, are related to the analysis filters according to:

$$G_0(z) = H_1(-z) = z^{-N} \tilde{H}_0(z)$$

and $$G_1(z) = -H_0(-z) = z^{-N} \tilde{H}_1(z)$$

Then the high and low band signals are added for the first octave and filtered through the high and low band filters in the first octave with the output signals being added together to create a discrete-time signal $a(n)$. The recreated discrete-time signal, $a(n)$, would be a perfect reconstruction of the original signal, assuming that no transmission or quantization errors occur. As can be seen, both the decomposition and reconstruction filter banks are relatively easy to implement with the adaptive size filtration hardware, allowing for the subband coding of signals with minimal computational complexity.

FIG. 3 represents a timing diagram for the wavelet packet tree filter implemented in FIG. 2. The vertical axis represents the different octave stages while the horizontal axis represents signal samples, clock cycles, or work cycles. The necessary calculations may be accomplished in a pipeline architecture where signal samples are cached until valid coefficients are available or a single signal architecture where each work cycle represents the time it takes to process the coefficients through the routing network through the multipliers and through the adders so that valid data is available at the output switches at the end of the work cycle. The second architecture effectively requires a variable length work cycle, recognizing that the resulting output signals need to ripple through the adders to the appropriate output line.

As can be seen in the first octave signals $b_1(n)$ 210a and $b_2(n)$ 210b are generated every two work cycles from signal samples of $a(n)$. As such, the filter is not being used every other work cycle and in the third work sample or signal sample, the second octave signals $c_1(n)$–$c_4(n)$ 211 are calculated. As two coefficients are needed to calculate the wavelet packet tree two signals must be collected. The second half of the collection occurs at time instances 4 and 6 so that the second coefficients $c_1(n)$–$c_4(n)$ 211 can be created and then two valid second octave signals are available to create the third octave signals $d_1(n)$–$d_8(n)$ 212 in the ninth work cycle. Assuming a continuous signal strand this filtration process can go into the negative sampling range and continue on in the positive range as well.

Figure 4:
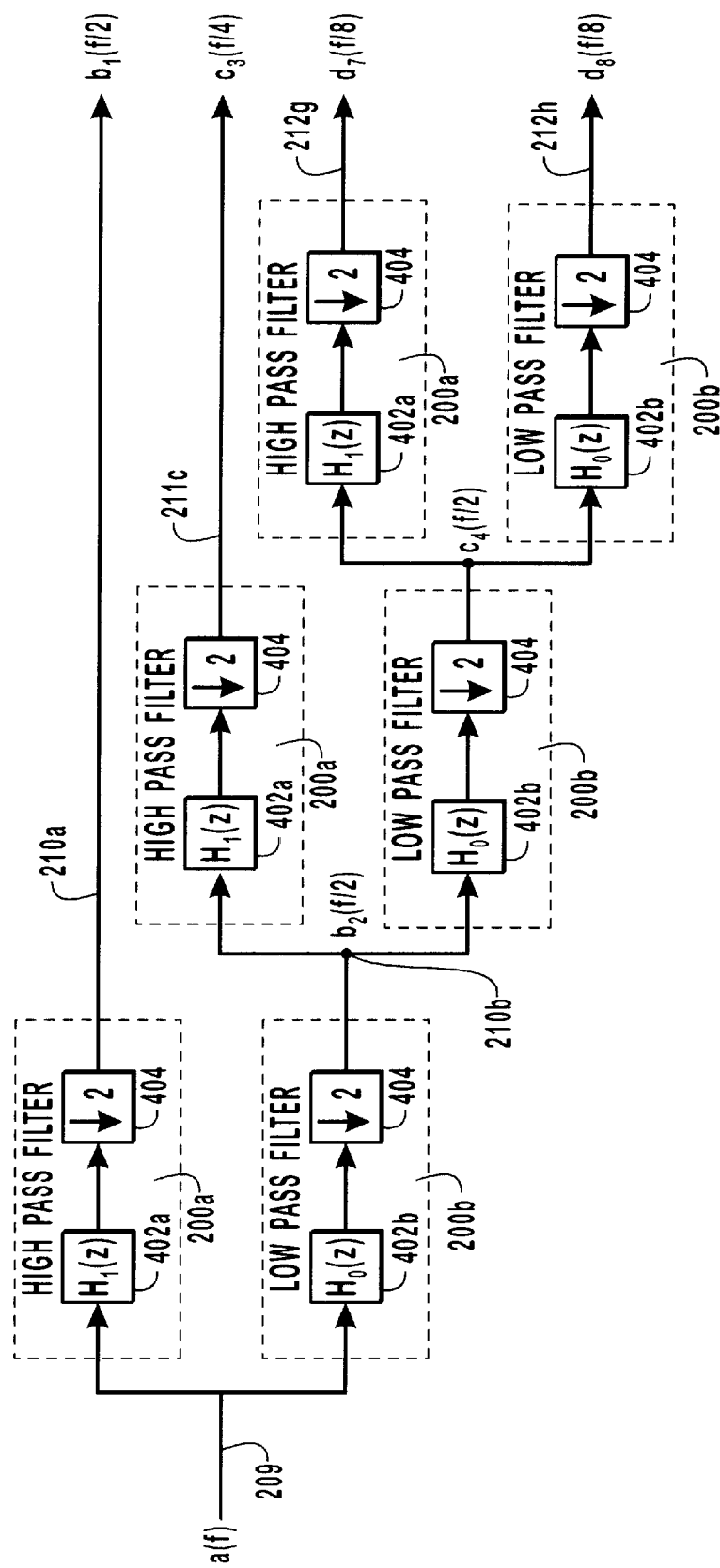
FIG. 4 illustrates a filter bank structure implementing a wavelet transform.

FIG. 4 illustrates the capability of the preferred embodiment to be backward compatible with the recursive pyramid algorithm for the DWT. Traditionally filters that implement the wavelet packet tree use a high subband filter 402a with a transfer function $H_1(z)$, followed by a decimation operator or downsampling module 404 that removes one out of every two signal samples in the filtered discrete-time signal. This combination is designated $H_1(z)$ 200a in FIGS. 2 and 4. The other component of the traditional wavelet packet tree is the low subband filter 402b with the transfer function $H_0(z)$, followed by a decimation operator or a downsampling module 404. This combination is designated $H_0(z)$ 200b in FIGS. 2 and 4. The adaptive size filter may adjust size easily and therefore implement a varied assortment of fixed size filter architectures. For example, any orthogonal transform can be implemented with the adaptive size filter bank of the present invention.

With respect to FIG. 5, the wavelet packet tree filter bank structure may also be configured for signal reconstruction. As previously discussed, synthesis filters $G_1(z)$ and $G_0(z)$ represent high and low pass filters, individually configured to recreate a discrete-time signal. If no transmission or quantization errors were introduced during the transmission, the output signal of the wavelet packet tree filter bank structure is a perfect reconstruction.

The individual synthesis filters 530, 520, and 500 increase the number of coefficients for each octave 505, 503, and 502. Individually the synthesis filters have different coefficient requirements at each level, but collectively the total number of coefficients remains the same. As such the filter principles previously described for decomposition remain true for reconstruction, although signal reconstruction requires an increase in individual synthesis filter coefficients with each octave level as opposed to the reduction of filter coefficients previously seen by the analysis filters.

For example, FIG. 5 can illustrate the increase in taps for a sixteen-tap embodiment of a reconstruction wavelet packet tree where the synthesis filters are designed to have equal bandwidth frequency responses. In a sixteen-tap embodiment, the initial octave 505 requires two taps for each of the four high pass $G_1(z)$ filters 530a and two taps for each of the four low pass $G_0(z)$ filters 530b receiving signals $d_1(n)$–$d_8(n)$. In the second octave 503, there are four taps for each of the high pass $G_1(z)$ filters 520a connected to the resulting high signal $c_1(n)$ on line 511a and four on the resulting low signal $c_3(n)$ on line 511c making a total of eight taps performing the high pass filtration. The low pass filter, $G_0(z)$ 520b, also has four taps for the $c_2(n)$ signal on line 511b and four taps from the $c_4(n)$ signal on line 511d. Thus, the number of taps used in the low and high pass filtration remains at sixteen. In the third octave 502, there is one $G_1(z)$ filter 500a on the high pass signal reconstruction and one $G_0(z)$ 500b filter on the low pass signal reconstruction, once again using the equivalent number of filter coefficients as the first octave 505. Taking advantage of the overall constancy of total coefficients used in each octave level and the general increase in coefficients for the individual filters between each octave level allows the same hardware to calculate an entire reconstruction wavelet packet tree. This provides the user an efficient manner of obtaining higher resolution with the same size filter processor. As previously mentioned, reconstruction wavelet packet tree filters may increase their size by linking several filters together. While this example discusses a sixteen tap filter embodiment, it is important to note that the wavelet packet tree filter bank structure depicted in FIG. 5 should not be limited to this sixteen tap embodiment, for example, the structure could represent any number of multiple tap configuration, in fact, the individual filters used by the structure need not be equal bandwidth filters. One advantage of the adaptive size filter is its flexibility in configuring the filter units described in FIG. 1 to meet a wide variety of filter bank structures and configurations as illustrated in FIGS. 2, 4, 5, and 6.

In one embodiment of a three-stage reconstruction wavelet transform system 515 similar to that depicted in FIG. 5, original discrete-time signals, $d_1(n)$–$d_8(n)$ are input on lines 512a–512h. These original signals, $d_1(n)$–$d_8(n)$, are upsampled by signal filters 504 and filtered by filters 530a and 530b, which have the transfer functions $G_1(z)$ and $G_0(z)$, respectively. In the preferred embodiment of the invention, the analysis filters 530a and 530b are designed to have equal bandwidth frequency responses. Thus, the original signals, $d_1(n)$–$d_8(n)$, are combined from eight equal bandwidth sub-band signals consisting of low frequency sub-band signals and high frequency sub-band signals into signal a(n).

After the original signals, $d_1(n)$–$d_8(n)$ are upsampled and filtered by four $G_1(z)$ filters 530a and four $G_0(z)$ filters 530b in the first stage or first octave level 505, high frequency sub-band signals and low frequency sub-band signals are equally combined into four second octave sub-band input signals, $c_1(n)$–$c_4(n)$ on lines 511a–511d. These signals are then upsampled by signal filters 504 and filtered by two $G_0(z)$ filters 520b and two $G_1(z)$ filters 520a and combined to form a low frequency sub-band signal $b_2(n)$ on line 510b and a high frequency sub-band signal $b_1(n)$ on line 510a. Finally, in the third octave 502, the resulting low and high frequency second sub-band signals from the second octave are combined into a third sub-band signal a(n) on output line 509. In other words, the high band frequency sub-band signal $b_1(n)$ is upsampled by signal filter 504 and further filtered by $G_1(z)$ filter 500a and the low band frequency sub-band signal $b_2(n)$ is upsampled by signal filter 504 and further filtered by $G_0(z)$ filter 500b and the resulting signals are combined to create the third octave output signal a(n) on line 509.

In applications like signal communication, the resulting upsampled and filtered signal can then be optionally encoded by means of signal coders for transmission via output line 509. Once the signals arrive at the receiver section, a filter bank structure as depicted in FIG. 2, may be used to decompose the signal. Since upsampling occurred at each octave when the signal was reconstructed, a downsampling needs to occur at each octave as the signal is decomposed. This allows the total number of samples to be restored to the original signals, $d_1(n)$–$d_8(n)$. The synthesis filters, $G_0(z)$ and $G_1(z)$, used in reconstruction are related to the analysis filters used in decomposition according to:

$$G_0(z) = H_1(-z) = z^{-N}\tilde{H}_0(z)$$

and $$G_1(z) = -H_0(-z) = z^{-N}\tilde{H}_1(z)$$

As can be seen, both the decomposition and reconstruction filter banks are relatively easy to implement with the adaptive size filtration hardware, allowing for the sub-band coding of signals with minimal computational complexity.

Figure 6A:
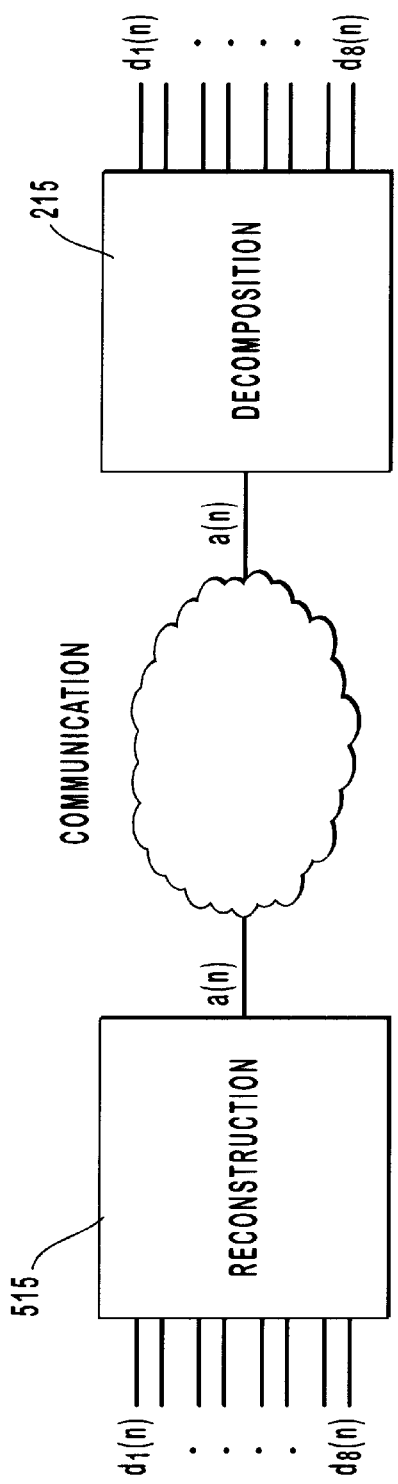
FIGS. 6a & 6b illustrate communication and compression configurations for multi-carrier modulation using decomposition and reconstruction filter bank structures.
Figure 6B:
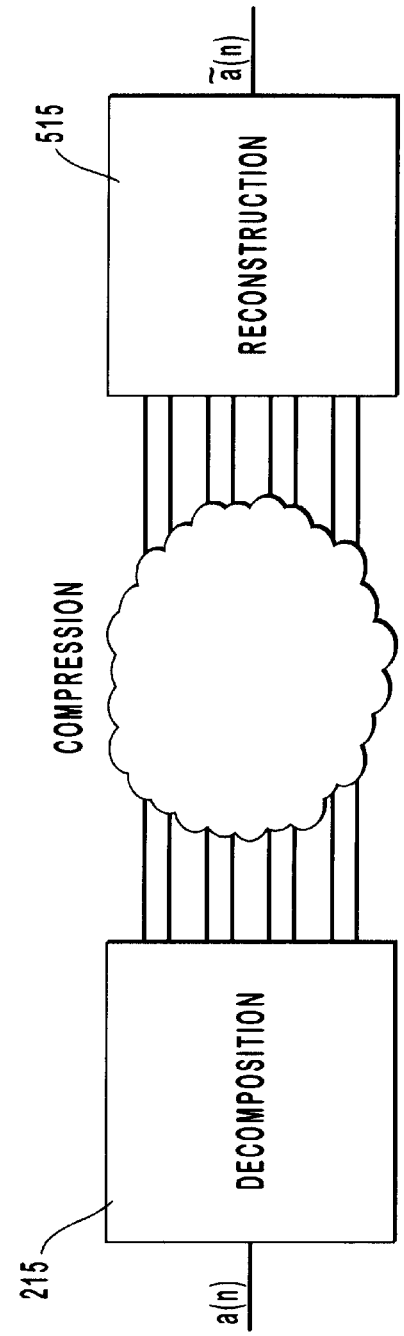

FIGS. 6a and 6b illustrate the predominant implementations for wavelet packet tree filter banks namely for data communication and data compression. The decomposition filter bank structure 215 takes a signal and transforms the signal for multi-carrier modulation. The reconstruction filter bank structure 515 takes multiple signals and transforms them into one signal. In communication applications, a reconstruction filter bank 515 sends an output signal across a transmission medium to a decomposition filter bank 215 input line. While the compression application will reverse this configuration, taking the decomposition filter bank 215 outputs and sending them across a transmission medium to the reconstruction filter bank 515 inputs.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and secured by United States Letters Patent is:

1. A method for calculating wavelet packet trees for use by an adaptive size filter system, the adaptive size filter system comprising
   (a) at least one source of signal coefficients;
   (b) at least two multipliers;
   (c) at least one adder; and
   (d) at least one adaptive data switch the method for calculating the wavelet packet tree comprising the steps of:
      (1) obtaining signal coefficients;
      (2) opening the at least one adaptive data switch based in part on the number of independent signal coefficients previously obtained and requested octave of signal filtration;
      (3) multiplying the signal coefficients to obtain a transitional output signal;
      (4) directing resulting transitional output signal according to setting of the at least one adaptive switch, namely adding transitional output signal to a rippling transitional output signal from neighboring adders if the at least one adaptive data switch is closed and sending the transitional output signal to an output interface if the at least one adaptive data switch is open; and
      (5) receiving an output signal at the output interface from at least one open adaptive data switch.

2. The method for calculating wavelet packet trees as recited in claim 1, wherein the adaptive size filter system is configured for signal decomposition, starting with a largest filter size wherein the adaptive data switches are mostly closed for a first octave and progressing through successive octaves by opening an exponentially based number of adaptive data switches.

3. The method for calculating wavelet packet trees as recited in claim 1, wherein the step of obtaining filter coefficients includes the step of retrieving the coefficients from a memory module location corresponding to a recently calculated wavelet packet from a previous octave.

4. The method for calculating wavelet packet trees as recited in claim 1, further comprising the step of opening adaptive data switches in a symmetrical fashion for each successive octave.

5. The method for calculating wavelet packet trees as recited in claim 1, further comprising the step of:
   if another octave of signal filtration is requested, directing the output signal to a memory module for eventual retrieval of the appropriate output signal from the memory module to at least one source of signal coefficients.

6. The method for calculating wavelet packet trees as recited in claim 1, wherein the adaptive size filter system is configured for signal reconstruction, starting with synthesis filters wherein adaptive data switches are deployed to create a smallest synthesis filter size in the first octave and the output signals are directed to successive octaves in the wavelet packet tree until there is a single output signal from the octave, wherein the larger synthesis filters of each octave are created by closing adaptive data switches.

7. The method for calculating wavelet packet trees as recited in claim 1, further comprising the step of:
   alternating signal sampling calculation periods between octaves such that a first octave calculation is followed by a downsampling period filled by a later octave calculation.

8. An adaptive size wavelet computation filter, comprising:
   a data interface;
   a routing network digitally connected to said data interface;
   an adaptive array of multipliers digitally connected to the routing network;
   an adaptive summation device for collecting the output from the multipliers; and
   an output interface for either distributing the output signals or returning them for additional filtering.

9. An adaptive size wavelet filter as recited in claim 8, wherein the multipliers and summation devices are configured for serial computation.

10. An adaptive size wavelet filter as recited in claim 8, wherein the multipliers and summation devices are configured to calculate values in parallel.

11. An adaptive size wavelet filter as recited in claim 8, wherein the routing network and output interface are reconfigurable and programmable such that the wavelet filter may also perform generic filtration operations to implement any orthogonal transform.

12. An adaptive size wavelet filter as recited in claim 8, wherein the adaptive size wavelet filter is connected through its output interface to a neighboring adaptive size wavelet filter through a data interface thereby creating a larger filter that may ripple wavelet signal results across several connected adaptive size wavelet filters.

13. An adaptive size wavelet filter as recited in claim 8, wherein the adaptive summation devices further comprise an array of adders and an array of data switches, wherein switches in the array of data switches are individually adjustable between a ripple adder configuration and a connection setting to the output interface.

14. An adaptive size wavelet filter as recited in claim 13, wherein the array of data switches are programmably configured based on the signal octave and the associated signal coefficients, thereby allowing the adaptive size wavelet filter configuration to change with each signal sampling.

15. An adaptive size filter bank, comprising:
   a bi-directional memory interface for receiving and sending signal coefficients from an external memory module;
   a filter routing network module for selectively pairing signal coefficients relative to an adaptive filter size, the filter routing network being electronically attached to the memory interface;
   an adaptive array of individual interconnected filter units, electronically attached to said filter routing network module;
   a variable size signal output interface, electronically attached to said adaptive size array of filter units; and
   a variable size signal input interface.

16. The adaptive size filter bank, as recited in claim 15, wherein the adaptive size array of interconnected filter units comprises:
   an adaptive size array of multipliers electronically attached to said filter routing network module;
   an adaptive size array of adders electronically collecting output from the adaptive size array of multipliers; and
   an adaptive array of data switches electronically attached to an output of said adaptive size array of adders.

17. The adaptive size filter bank, as recited in claim 15, wherein the variable size signal input interface is electronically connected to said array of individual filter units and said filter routing network module to enable rippling between filter banks.

18. The adaptive size filter bank, as recited in claim 15, wherein the filter banks are configured for decomposition of a signal, causing the adaptive size filter bank to change size for each octave.

19. The adaptive size filter bank, as recited in claim 15, wherein the filter banks are configured for synthesis of a signal, resulting in the adaptive size filter bank to increase a number of taps per divisible filter bank section for each octave.

20. The adaptive size filter bank, as recited in claim 15, wherein the filter bank may be programmably altered to perform any orthogonal transform.

* * * * *